(12) United States Patent
Monnet et al.

(10) Patent No.: US 6,657,180 B1
(45) Date of Patent: Dec. 2, 2003

(54) DETECTOR WITH SEMICONDUCTOR FOR DETECTING IONIZING RADIATION HAVING A PLANE CONDUCTING STRUCTURE

(75) Inventors: Olivier Monnet, Tullins (FR); Jean-Paul Bonnefoy, Grenoble (FR); Corinne Mestais, La Terrasse (FR); Francis Sauvage, Moirans (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/926,616

(22) PCT Filed: May 25, 2000

(86) PCT No.: PCT/FR00/01417
§ 371 (c)(1),
(2), (4) Date: Nov. 26, 2001

(87) PCT Pub. No.: WO00/72381
PCT Pub. Date: Nov. 30, 2000

(30) Foreign Application Priority Data

May 25, 1999 (FR) .............................. 99 06568

(51) Int. Cl.⁷ .............................................. H01L 31/00
(52) U.S. Cl. ............................... 250/214.1; 250/208.1; 250/214 R
(58) Field of Search .......................... 250/214.1, 208.1, 250/214 R, 214 LA, 226, 216, 239; 356/221–226; 257/291, 290

(56) References Cited

U.S. PATENT DOCUMENTS 5,552,596 A * 9/1996 Ravetto et al. .......... 250/208.1

OTHER PUBLICATIONS

Patent Abstracts of Japan, JP 57–039585, Mar. 4, 1982.
M. Arques, et al., 1998 IEEE Nuclear Science Symposium Conference Records, vol. 1, pps. 666–671, "A Basic Component for ISGRI, The CdTe Gamma Camera on Board the Integral Stellite", Nov. 8–14, 1998.
H. Bedoui, et al., Innov. Techn. Biol. Med., vol. 19, No. 1, pps. 51–57, "Realisation et Evaluation des Performances D'Une Camera Miniature Peroperatoire CDTE (Realisation and Performance Assessment of a Peroperative CDTE Mini–Camera)", 1998 (Month Unknow).

* cited by examiner

Primary Examiner—Que T. Le
(74) Attorney, Agent, or Firm—Oblon, Spivak, McClelland, Maier & Neustadt, P.C.

(57) ABSTRACT

A semiconductor detector including at least one block of detector pixels, each detector pixel being composed of a semiconductor element with a first face covered by a first armature and a second face covered by a second armature. The detector pixels are assembled side by side such that the first armatures define a detector plane. The first armatures are covered by a plane conducting structure that connects them together electrically. The detector does not have any dead area in which detection is impossible. The semiconductor is particularly applicable to detection of ionizing radiation (gamma rays, X-rays, etc.)

16 Claims, 4 Drawing Sheets

DETECTOR WITH SEMICONDUCTOR FOR DETECTING IONIZING RADIATION HAVING A PLANE CONDUCTING STRUCTURE

TECHNICAL FIELD AND PRIOR ART

The invention relates to a semiconductor detector for the detection of ionizing radiation (gamma rays, X-rays, etc.).

More particularly, the invention relates to a device for supplying the polarization voltage of the semiconductor detector for detection of ionizing radiation (gamma rays, X-rays, etc.).

The invention relates particularly to fields in which the detected radiation is high-energy radiation, for example such as astrophysics or nuclear medicine.

A semiconductor detector is in the form of a mosaic of elementary detectors, or pixels, assembled together to form at least one detector block.

Each detector pixel is composed of one semiconducting element, for example CdZnTe, placed between two armatures.

A detector pixel converts the energy in photons received by it into charge carriers. Charge carriers are collected using a polarization voltage applied to the armatures of the detector pixel.

Detector pixels are glued onto an electronic substrate that includes a polarization resistance, a coupling capacity and a load preamplifier. The signal is amplified and shaped by an electronic measurement circuit.

In order to more efficiently detect high-energy radiation, the semiconducting element located between the armatures of the detector pixels has to be thickened.

A higher polarization voltage is necessary to polarize a thicker semiconductor detector. The voltage can thus be as high as several hundred volts.

For example, the polarization voltage for the ISGRI (Integral Soft Gamma Ray Imager) imager onboard the INTEGRAL (INTErnational Gamma-Ray Astrophysics Laboratory) satellite is typically equal to 200 V.

Polarization voltages for the PEGASE (*Projet d'Etude de Gamma caméra A SEmiconducteur*—study project for semiconductor gamma camera) are between 500 V and 1000 V.

The semiconductor detector for the ISGRI imager is described in the document entitled "A Basic Component for ISGRI, the CdTe Gamma Camera on Board the INTEGRAL Satellite", M. Arques et al., published in "Paper presented at Toronto 1998 IEEE NSS conference".

A detector block for the ISGRI imager is shown in FIG. 1.

FIG. 1 shows a top view of a block of detector pixels according to the ISGRI imager. The block of detector pixels is composed of 16 detector pixels P assembled side by side to form a 4×4 matrix. Each detector pixel P has an armature A on its top face. The complete set of armatures A with detector pixels P defines a detector plane exposed to the radiation to be detected.

The polarization voltage is brought to the armatures A using a wire F. The wire F is bent and glued to distribute the polarization voltage to the set of armatures A. Bending and gluing of wire F are difficult and expensive operations.

The polarization voltage originates from a power supply device external to the detector (not shown in the figure) through a current wire on the electronic substrate located at the back of the detector block. It is then necessary to pass the wire along the detector block in a direction approximately perpendicular to the detector plane. In order to avoid any false contact, the wire F is encased in a jacket G in the area in which it connects the back face and the front face of the detector block.

The jacket G is composed of an insulator with a thickness that increases as the voltage carried by the wire increases.

When several detector blocks are assembled side by side to form a unique detection assembly, the size of the jacket G on each detector block creates a dead non-detection area in the detector plane. This dead area in which there is no detection is larger when the polarization voltage is high. This is a disadvantage.

As mentioned above, the polarization voltage passes through the electronic substrate at the back of the detector block. The back face of the detector block is also the area in which useful signals originating from radiation detection and all electrical signals necessary for operation of the measurement electronics circuit, are present.

Thus, local precautions are necessary between the polarization voltage and other signals. These precautions become particularly difficult to achieve when the polarization voltage is high and when the useful signals are equal to, for example, a few Femtocoulombs. It is then necessary to keep the polarization voltage separate from the useful signals, which reduces the useful area of the electronic substrate located on the back. This reduction of the useful area may be such that it is impossible to design a circuit that operates reliably.

The document entitled "*Réalisation et evaluation des performances d'une camera miniature péropératoire CDTE*—Manufacture of a CDTE miniature surgical camera and evaluation of its performances", Bedoui H. et al., published in Innov. Tech. Biol. Med., vol. 19, No. 1, 1998, also discloses a semiconductor detector according to prior art. The detector pixels in this case are also grouped into detector blocks.

Each detector pixel of a detector block is individually polarized by a wire connected to the periphery of the detector plane. A dead area in which there is no detection then appears where the wires pass. Therefore, this solution limits the detection area and makes it impossible to make large detection areas. For example, it is impossible to make 200×200 $mm^2$ detection areas like those envisaged for PEGASE.

PRESENTATION OF THE INVENTION

The invention does not have the disadvantages mentioned above.

The invention relates to a semiconductor detector comprising at least one first detector block composed of elementary detector pixels assembled side by side on the same substrate, each elementary detector pixel being composed of a semiconducting element with a first face covered by a first armature and a second face covered by a second armature, the elementary detector pixels being assembled side by side such that the first armatures define a detector plane and the second armatures define an approximately plane surface in contact with the substrate. The first armatures are covered by a plane conducting structure that connects them together electrically.

One advantage of the invention is that it can be used to make a semiconductor detector with almost no non-detection area.

BRIEF DESCRIPTION OF THE FIGURES

Other characteristics and advantages of the invention will become clear after reading the following preferred embodiment of the invention with reference to the appended figures in which.

The same marks denote the same elements in all figures.

DETAILED DESCRIPTION OF EMBODIMENTS OF THE INVENTION

Figure 1:
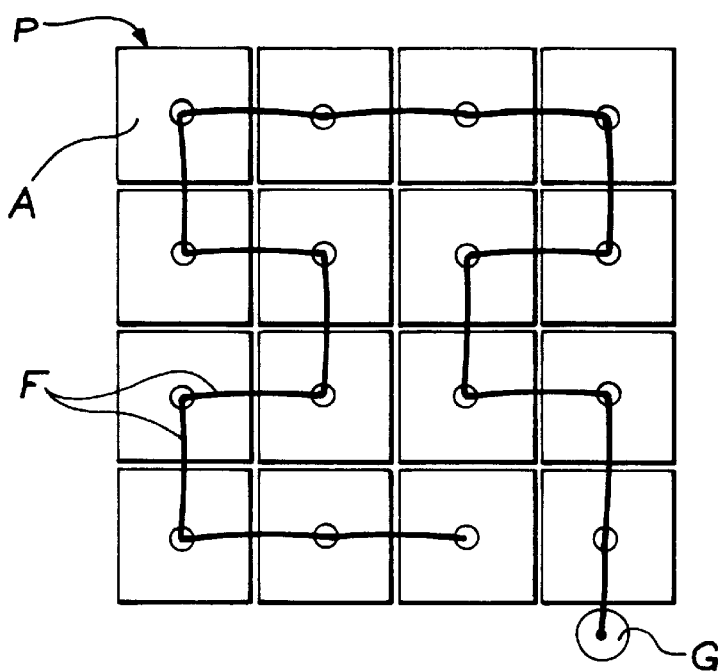
FIG. 1 shows a block of detector pixels according to prior art.

FIG. 1 has already been described. Therefore there is no point in describing it again.

Figure 2:
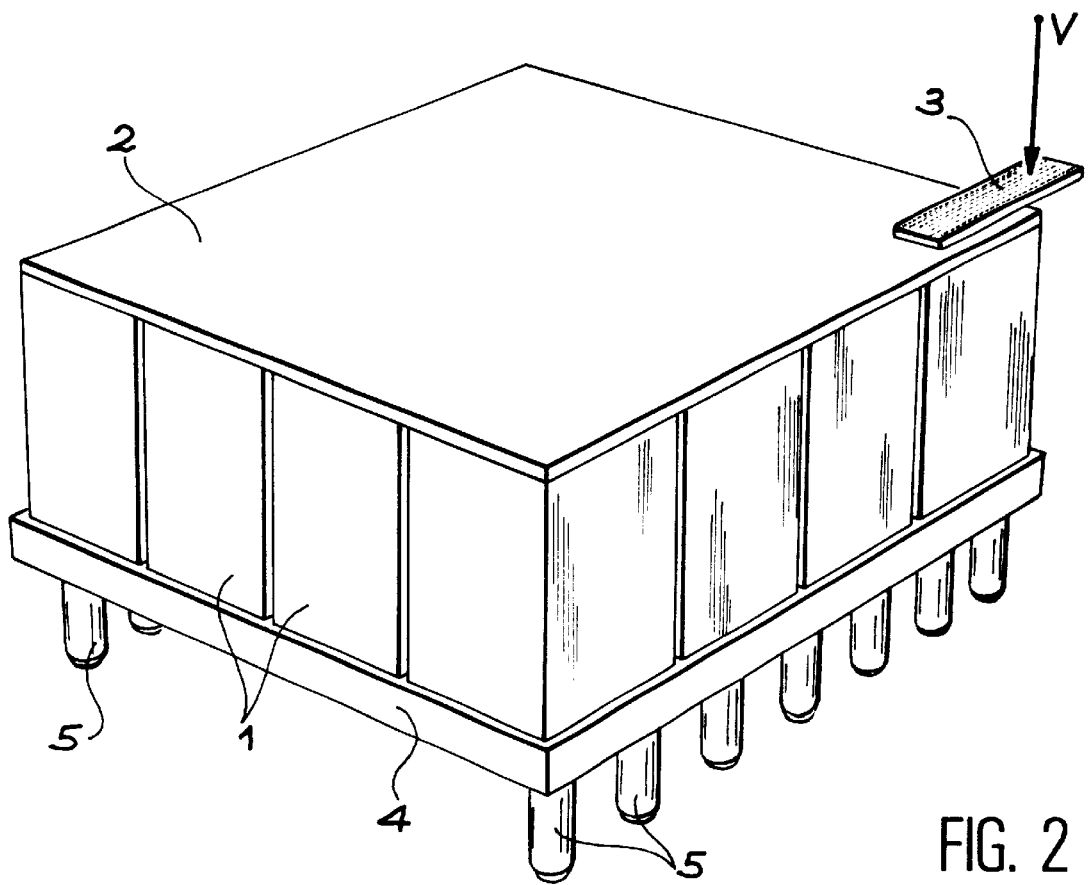
FIG. 2 shows a block of detector pixels according to the invention.

FIG. 2 shows a block of detector pixels according to the invention.

As a non-limitative example, the block of detector pixels is composed of 16 elementary detector pixels laid out side by side in the form of a 4×4 matrix.

Each elementary detector pixel is composed of a semiconducting element 1 on which the first face is covered by a first armature (not shown in the figure) and the second face is covered by a second armature (not shown in the figure).

The first armatures of the different detector pixels are covered with the same plane conducting structure 2. For example, the plane conducting structure may be a Mylar® type circuit covered by a copper deposit.

An electrical connection 3 is used to connect the conducting structure 2 to a polarization voltage V. Therefore when the electrical connection 3 is connected to the polarization voltage V, all the first electrodes are polarized at the same value.

A modular substrate 4 containing electrical circuits designed to collect and process useful signals output from detector pixels covers all the first and second armatures of the detector pixels. Electrical connections 5 are used to access useful electrical signals and electrical signals necessary for operation of the electrical circuits contained in the modular substrate 4.

Advantageously according to the invention, the polarization voltage V is remote from the useful signals. The polarization V is only distributed on the same side as the detector plane and useful signals are distributed on the side opposite the detector plane. The polarization voltage can then be distributed by means of a structure independent of the modular substrate.

FIGS. 3A, 3B, 3C and 3D show four alternatives for an assembly of two blocks of detector pixels according to the invention.

Figure 3A:
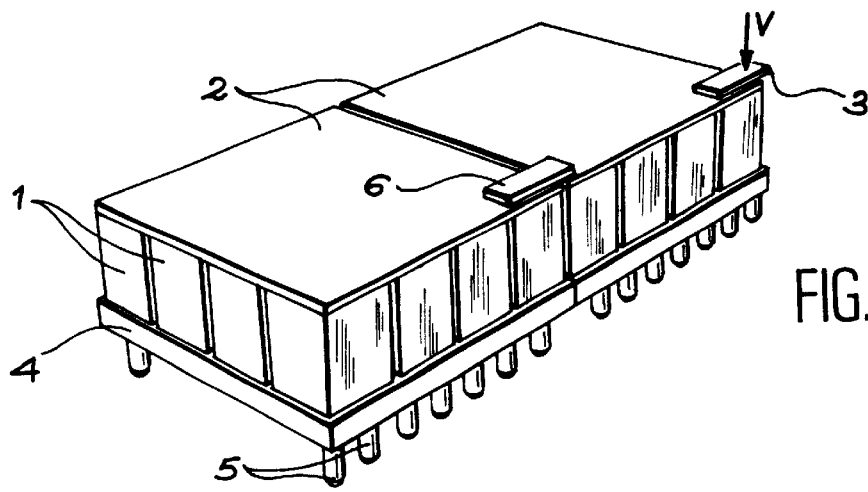
FIGS. 3A, 3B, 3C, 3D represent four alternatives of an assembly of two blocks of detector pixels according to the invention.

According to the first alternative shown in FIG. 3A, the two blocks of detector pixels are assembled side by side and the plane conducting structures 2 are connected by a conducting tab 6. The polarization voltage V is distributed to all detector pixels of the two blocks through an electric connection 3 connected to the plane conducting structure of one of the blocks.

Figure 3B:
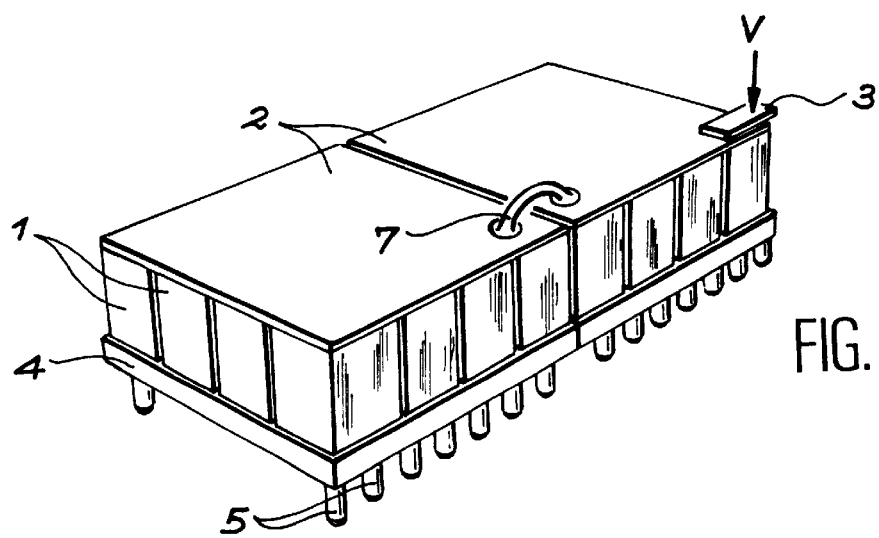

According to the second alternative shown in FIG. 3B, the conducting planes for the two detector blocks are connected by a wire 7.

Figure 3C:
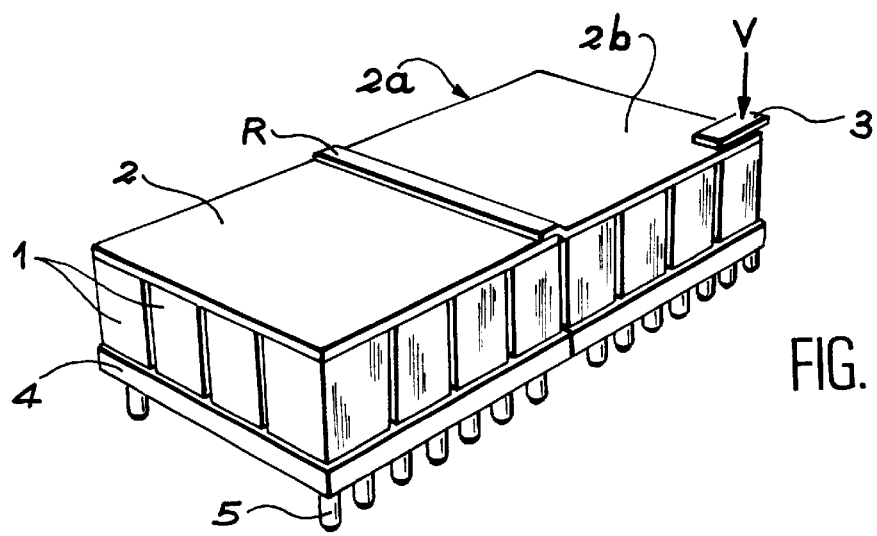
Figure 3:
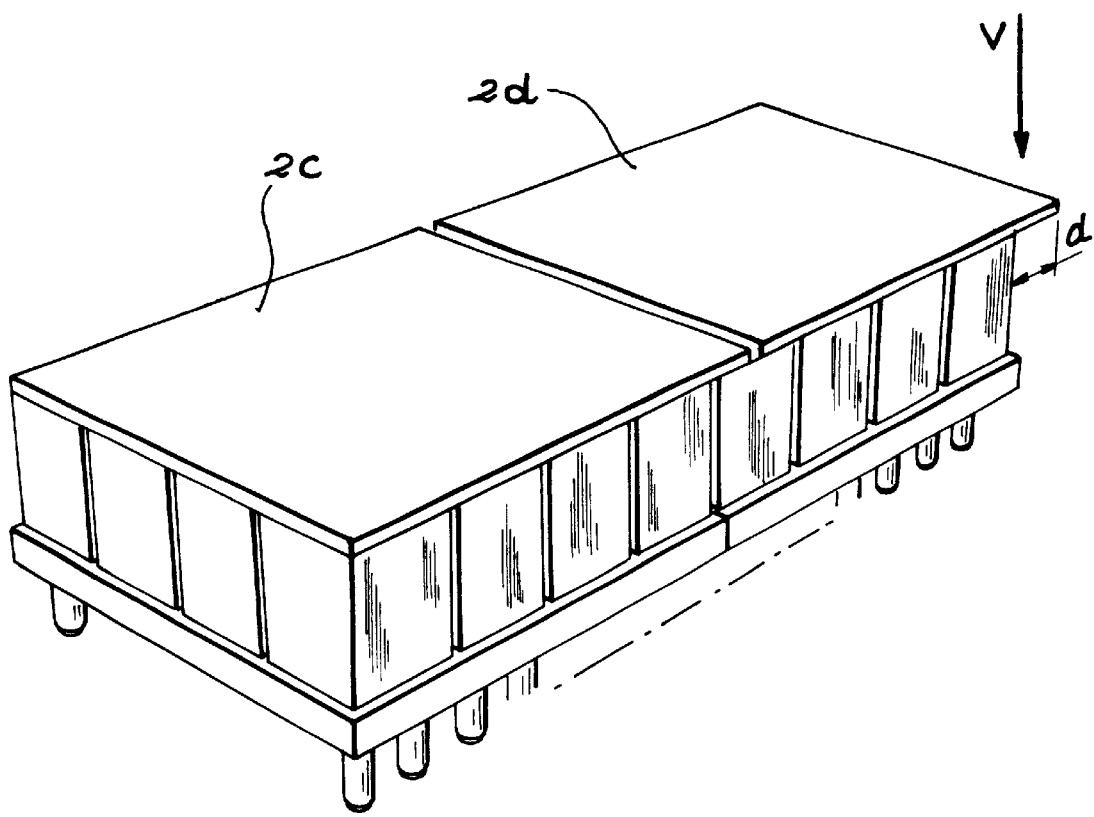

According to the third alternative shown in FIG. 3C, there is an overlap R between the conducting structures that overlap the first armatures of the two adjacent blocks.

The first armatures of a first detector block are then covered by a plane conducting structure 2 like that mentioned above and the first armatures of the adjacent detector block are covered by a conducting structure 2a composed of a plane conducting structure 2b and a step-shaped area to enable overlap R.

According to the fourth alternative shown in FIG. 3D, the plane conducting structures are offset from the detector blocks. The plane conducting structure 2c that covers the first armatures of the detector pixels in a first block partially covers the detector pixels in the adjacent block.

The plane conducting structure 2c also covers all the first armatures of one of the two detector blocks. The first armatures of the other detector block are then covered by a plane conducting structure 2d that projects beyond the detector block over a distance d. The part of the plane conducting structure 2d that projects beyond the detector block over a distance d then forms a connection element for the set of the two detector blocks at the polarization voltage V.

Regardless of what alternative is used, the combination of two blocks of detector pixels as described above has the advantage already mentioned for a single block, namely distribution of the polarization voltage through a structure independent of the modular substrates. The polarization voltage is distributed on the side of the detector planes and useful signals are distributed on the side opposite the detector plane.

FIGS. 3A, 3B, 3C, 3D show a semiconductor detector made by combining two blocks of detector pixels. However, more generally, the invention also comprises a semiconductor detector made by combining more than two blocks of detector pixels, as will now be described with reference to FIG. 4 as a non-restrictive example.

Figure 4:
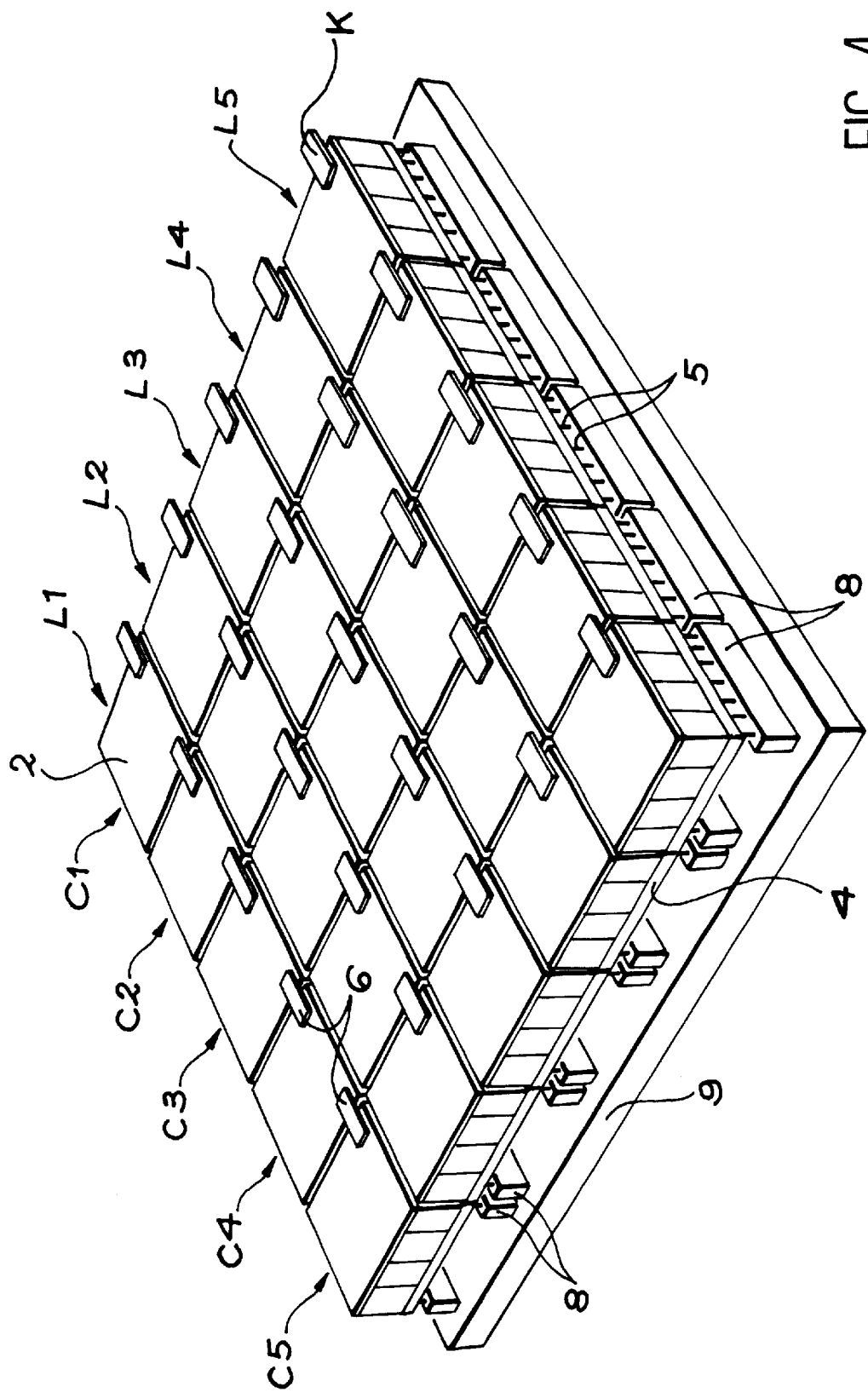
FIG. 4 shows a matrix of detector blocks according to a particular embodiment of the invention.

FIG. 4 shows a matrix of detector blocks according to a first particular embodiment of the invention.

The matrix of detector blocks comprises 25 detector blocks in the form of a matrix of 5 rows L1, L2, L3, L4, L5 and 5 columns C1, C2, C3, C4, C5. More generally, the invention relates to a matrix of detector blocks in the form of a matrix of N rows and M columns, where M and N are integers equal to or greater than 1.

Plane conducting structures 2 of blocks of detector pixels on the same row Lj (j=1, 2, 3, 4, 5) are connected to each other through a series of conducting tabs 6 as shown in FIG. 3A. According to other embodiments, the conducting structures that cover the detector blocks can be connected to each other as described in FIGS. 3B, 3C or 3D.

The electrical connections 5 output from each modular substrate 4 are plugged into a support element 8. The support elements 8 of the different detector blocks are added onto a common structure 9 that groups the various detector blocks in a single block.

An electrical connection element K located at the end of a row Lj (j=1, 2, 3, 4, 5) is used to connect the different conducting structures 2 of detector blocks in the same row Lj, to a voltage Vj.

Advantageously, according to the embodiment shown in FIG. 4, each row Lj (j=1, 2, 3, 4, 5) of detector blocks can then be polarized with a power supply voltage that is specific to it. However, several rows of detector blocks can be connected to the same power supply voltage.

The invention can be used to make large detector block matrices, for example 200×200 mm², in which the power supply structure for the polarization voltage is well separated from the modular substrates 4 through which the detected signals pass.

Advantageously, a matrix of detector blocks according to the invention does not comprise any dead non-detection area.

Another advantage of the invention is that assembly/disassembly of detector blocks is easy. For example, if there is a failure in a detector block, it is very easy to replace the defective detector block by a detector block that is operating correctly.

What is claimed is:

1. Semiconductor detector for detection of ionizing radiation comprising at least one first detector block composed of elementary separable detector pixels assembled side by side directly on a same substrate, each elementary detector pixel being composed of a semiconducting element with a first face covered by a first armature and a second face covered by a second armature, the elementary detector pixels being assembled side by side such that the first armatures define a detector plane and the second armatures define an approximately plane area in contact with the substrate, wherein the first armatures are covered by a plane conducting structure that connects them together electrically.

2. Semiconductor detector according to claim 1, wherein the substrate is a modular substrate containing electrical circuits to collect and process signals output from elementary detector pixels in the block.

3. Semiconductor detector according to claim 1, wherein the plane conducting structure that covers the first armatures of detector pixels in a first detector block is connected through an electrical connection to the plane conducting structure that covers the first armatures of the detector pixels in at least one second detector block adjacent to the first detector block.

4. Semiconductor detector according to claim 3, wherein the semiconductor detector is structured in a form of a matrix of N rows of M blocks, the plane conducting structures that cover the first armatures of the elementary detector pixels of two adjacent detector blocks on a same row being connected by an electrical connection, the plane conducting structure of a detector block located at an end of a row being connected to an electrical connection element to apply a voltage.

5. Semiconductor detector according to claim 3, wherein the electrical connection is a tab or a connecting wire or an overlap of one of the conducting structures by the adjacent conducting structure.

6. Semiconductor detector according to claim 1, wherein the plane conducting structure that covers the first armatures of the elementary detector pixels of a first detector block partially covers the elementary detector pixels of at least one adjacent detector block.

7. Semiconductor detector according to claim 6, wherein the semiconductor detector is structured in a form of a matrix of N rows of M blocks, the plane conducting structure that covers the first armatures of the elementary detector pixels of a first detector block of a row partially covering the elementary detector pixels of a detector block in a same row adjacent to the first detector block.

8. Semiconductor detector according to claim 3, wherein each detector block comprises electrical connections providing access to useful electrical signals output from elementary detector pixels and electrical signals necessary for operation of electrical circuits contained in the modular substrate, the electrical connections of one detector block being plugged into a support element, the support elements of the various detector blocks being added onto a common structure.

9. Semiconductor detector according to claim 1, wherein the plane conducting structure is a Mylar® type circuit covered by a copper deposit.

10. Semiconductor detector according to claim 2, wherein the plane conducting structure that covers the first armatures of detector pixels in a first detector block is connected through an electrical connection to the plane conducting structure that covers the first armatures of the detector pixels in at least one second detector block adjacent to the first detector block.

11. Semiconductor detector according to claim 10, wherein the semiconductor detector is structured in a form of a matrix of N rows of M blocks, the plane conducting structures that cover the first armatures of the elementary detector pixels of two adjacent detector blocks on a same row being connected by an electrical connection, the plane conducting structure of a detector block located at an end of a row being connected to an electrical connection element to apply a voltage.

12. Semiconductor detector according to claim 10, wherein the electrical connection is a tab or a connecting wire or an overlap of one of the conducting structures by the adjacent conducting structure.

13. Semiconductor detector according to claim 2, wherein the plane conducting structure that covers the first armatures of the elementary detector pixels of a first detector block partially covers the elementary detector pixels of at least one adjacent detector block.

14. Semiconductor detector according to claim 13, wherein the semiconductor detector is structured in a form of a matrix of N rows of M blocks, the plane conducting structure that covers the first armatures of the elementary detector pixels of a first detector block of a row partially covering the elementary detector pixels of a detector block in a same row adjacent to the first detector block.

15. Semiconductor detector according to claim 10, wherein each detector block comprises electrical connections providing access to useful electrical signals output from elementary detector pixels and electrical signals necessary for operation of electrical circuits contained in the modular substrate, the electrical connections of one detector block being plugged into a support element, the support elements of the various detector blocks being added onto a common structure.

16. Semiconductor detector according to claim 2, wherein the plane conducting structure is a Mylar® type circuit covered by a copper deposit.

* * * * *